United States Patent [19]

Pricer

[11] 4,287,576

[45] Sep. 1, 1981

[54] SENSE AMPLIFYING SYSTEM FOR MEMORIES WITH SMALL CELLS

[75] Inventor: Wilbur D. Pricer, Burlington, Vt.

[73] Assignee: International Business Machines Corporation, Armonk, N.Y.

[21] Appl. No.: 134,259

[22] Filed: Mar. 26, 1980

[51] Int. Cl.³ ............................................. G11C 11/40
[52] U.S. Cl. .................................... 365/203; 365/208
[58] Field of Search ............... 365/174, 182, 203, 207, 365/208, 210

[56] References Cited

U.S. PATENT DOCUMENTS

| | | | |
|---|---|---|---|
| 3,387,286 | 6/1968 | Dennard | 365/182 |
| 3,811,076 | 5/1974 | Smith | 317/235 R |
| 3,841,926 | 10/1974 | Garnache et al. | 148/188 |
| 3,979,734 | 9/1976 | Pricer et al. | 365/174 |
| 4,040,017 | 8/1977 | Lee | 365/174 |
| 4,080,590 | 3/1978 | Pricer | 365/149 |
| 4,160,275 | 7/1979 | Lee et al. | 365/149 |
| 4,181,865 | 1/1980 | Kokyama | 365/208 |

*Primary Examiner*—Terrell W. Fears
*Attorney, Agent, or Firm*—Stephen J. Limanek

[57] ABSTRACT

A sense amplifying system is provided having first and second bit lines and first and second differential amplifiers arranged in tandem with a first isolation device connecting one side of the first amplifier to the first bit line and a second isolation device connecting the other side of the first amplifier to the second bit line and with a third isolation device connecting one side of the second amplifier to the first bit line and a fourth isolation device connecting the other side of the second amplifier to the second bit line. A precharging circuit charges the first and second lines to the same potential. The first amplifier is used to sense signals on the first line while using a reference voltage derived from the second line and the second amplifier is used to sense signals on the second line while using a reference voltage derived from the first word line.

10 Claims, 2 Drawing Figures

SENSE AMPLIFYING SYSTEM FOR MEMORIES WITH SMALL CELLS

TECHNICAL FIELD

This invention relates to integrated semiconductor memory circuits and more particularly to a sense amplifying system for memory circuits which have a very high density of small cells for storing binary digits of information.

BACKGROUND ART

Integrated semiconductor memory circuits, particularly those employing cells which include essentially a storage capacitor and a switch, have achieved high memory cell densities. One of the simplest circuits for providing small memory cells is described in commonly assigned U.S. Pat. No. 3,387,286, filed July 14, 1967, by R. H. Dennard. Each of these cells employs essentially only a storage capacitor and a field effect transistor acting as a switch to selectively connect the capacitor to a bit/sense line. In also commonly assigned U.S. Pat. Nos. 3,811,076 by W. M. Smith and 3,841,926 by R. H. Garnache and W. M. Smith, both filed Jan. 2, 1973, there is disclosed a one-device field effect transistor memory cell of the type described in the above-identified Dennard patent which is made to a small size by utilizing a layer of doped polycrystalline silicon separated by a dielectric medium disposed on the surface of a semiconductor substrate for forming a storage capacitor.

In commonly assigned U.S. Pat. No. 3,979,734, filed June 16, 1975, by W. D. Pricer and J. E. Selleck, there is described a memory array made of small cells which employ storage capacitors and bipolar transistors. In this array, each storage capacitor of these cells has simply one capacitor terminal or plate connected to a separate bit/sense line while selected cells forming a word are simultaneously accessed by utilizing a word pulse for coupling to the other terminal or plate of the storage capacitors of that word.

In another commonly assigned U.S. Pat. No. 4,080,590, filed Mar. 31, 1976, by W. D. Pricer, there is disclosed a merged charge memory produced in a unipolar technology which is provided with very small capacitor cells, each of which includes substantially only a small storage capacitor having a bit/sense line connected to one terminal of the capacitor and a word line providing a coupling to the other terminal of the capacitor. In an embodiment of that invention, a direct current source of charges is produced at the surface of a semiconductor substrate and a plurality of inversion storage capacitors are formed also at the surface of the semiconductor substrate in a spaced-apart relationship from the charge source. Voltage pulses representing binary digits are applied to one terminal of the capacitors and the other terminal of the capacitors is coupled to the direct source of charges by the application of a word pulse to a word line.

In yet another commonly assigned U.S. Pat. No. 4,040,017, filed Mar. 31, 1976, by H. S. Lee, there is disclosed a capacitor memory similar to that disclosed in the above-identified U.S. Pat. No. 4,080,590 wherein the charges are produced from a charge source in the form of pulses injected into the storage capacitors rather than by utilizing a direct current source of charges.

Semiconductor memories have generally been accessed in what is known as a two-dimensional accessing arrangement wherein a single word line controls a number of memory cells with each cell having a bit/sense line connected to input/output or control circuitry. However, it is known in the prior art that the input/output or control circuitry may be coupled to more than one bit/sense line to provide certain space saving advantages which may be required for sense amplifiers when very small cells of the above described type are used. Such accessing arrangements are at times referred to as a 2½ dimensional operation.

In commonly assigned U.S. Pat. No. 4,160,275, filed on Apr. 3, 1978, by H. S. Lee, W. D. Pricer and N. G. Vogl, Jr., there is disclosed an accessing arrangement wherein the minimum pitch of a sense amplifier may be several times the dimension of the desired or optimum bit line pitch of a merged charge memory array by selecting at one time only a small number of cells, such as a byte, associated with a word line for writing or reading purposes.

DISCLOSURE OF THE INVENTION

It is an object of this invention to provide an improved sense amplifying system permitting more efficient utilization of the surface area of a semiconductor chip.

It is another object of this invention to provide an improved sense amplifying system for a memory system having a high density of cells which is not limited by the size or pitch of the sense amplifying system.

It is yet another object of this invention to provide an improved sense amplifying system for a memory employing minimum spacing between bit/sense lines which is capable of detecting small signals.

It is still another object of this invention to provide an improved sense amplifying system for a memory of the one-device cell or merged charge memory type having a very high density of cells.

A further object of this invention is to provide an improved sense amplifying system for a memory having a high density of cells which does not require the complex circuitry of a 2½ dimensionally operated memory utilizing amplifiers shared by various cells of a word line.

Yet a further object of this invention is to provide an improved sense amplifying system for a memory having a very high density of cells which is arranged for two-dimensional operation without being limited by the pitch of the sense amplifying system.

Still a further object of this invention is to provide an improved sense amplifying system for a two-dimensionally operated memory wherein each sense amplifier connected to a given bit line may have a pitch equal to the pitch of four bit lines of the memory.

In accordance with the teachings of this invention, a sense amplifying system is provided having an amplifying and latching device, an isolating device for the amplifying and latching device and a distinct pull up device. More specifically, the sense amplifying system includes first and second access or bit lines, first and second differential amplifiers with isolation means for selectively coupling the amplifiers to the access lines and means for establishing a reference potential on the access lines. The first amplifier is used to sense the signals on the first bit line while using a reference voltage derived from the second bit line and the second amplifier arranged in tandem with the first amplifier is used to sense the signal on the second bit line while using a reference voltage derived from the first bit line. The first and second amplifiers are disposed preferably on one side of an array which includes the first and second bit lines, while third and fourth amplifiers, similar to the first and second amplifiers, are disposed on the opposite side of the array and are coupled to third and fourth bit lines which are also a part of the array.

The foregoing and other objects, features and advantages of the invention will be apparent from the following more particular description of the preferred embodiment of the invention, as illustrated in the accompanying drawings.

BEST MODE FOR CARRYING OUT THE INVENTION

Figure 1:
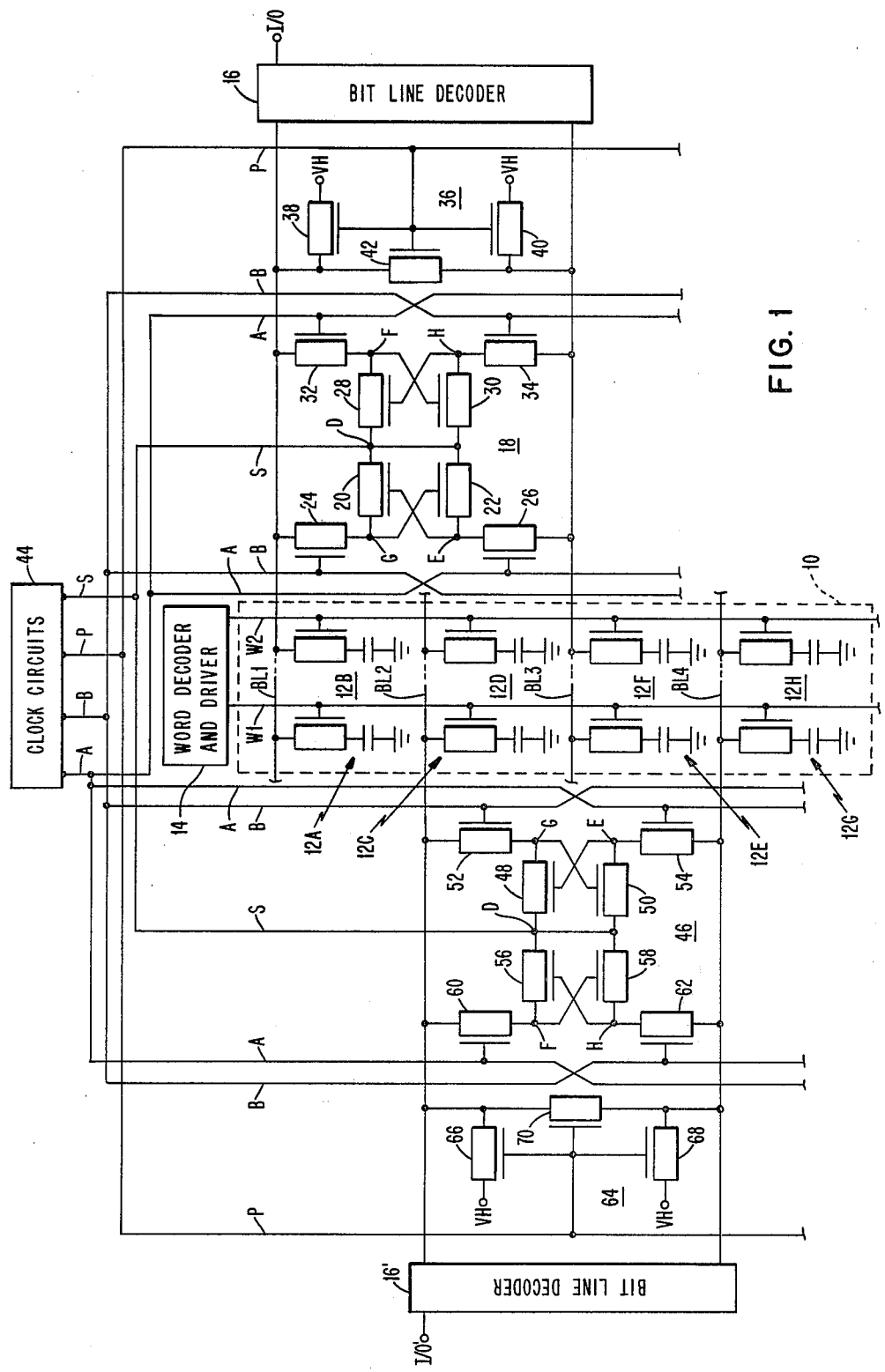
FIG. 1 is a circuit diagram of an embodiment of a sense amplifying system of the present invention.

Referring to FIG. 1 of the drawing in more detail, there is shown a memory which includes the sense amplifying system of the present invention. The memory also includes an array 10 of memory cells 12A and 12B connected to a first bit line BL1, cells 12C and 12D connected to a second bit line BL2, cells 12E and 12F connected to a third bit line BL3 and cells 12G and 12H connected to a fourth bit line BL4. Each of the cells is illustrated as being a one-device cell having a field effect transistor and a storage capacitor of the type disclosed in the above identified Dennard patent, but it should be understood that other types of small cells may also be used in the array 10. Cells 12A, 12C, 12E and 12G are also coupled to a first word line W1, with cells 12B, 12D, 12F and 12H being coupled to a second word line W2. Word lines W1 and W2 are connected to a word decoder and driver 14 which may be of any known appropriate type. A first bit line decoder 16 is connected to the first and third bit lines BL1 and BL3 and has an input/output terminal I/0, and a second bit line decoder 16' is connected to the second and fourth bit lines BL2 and BL4 and has an input/output terminal I/0'. The bit line decoders 16 and 16' may be of any known appropriate type and may differ from each other only in that each receives different addresses. Each of the decoders 16 and 16' may, as preferred, have one input/output terminal or as many as the number of bit lines connected to the decoder.

A first sense amplifying system 18 having a first pair of cross coupled field effect transistor devices 20 and 22 is coupled to the first and third bit lines BL1 and BL3 through first and second isolation devices or transistors 24 and 26, respectively. The first sense amplifying system 18 also includes a second pair of cross coupled field effect transistor devices 28 and 30 coupled to the first and third bit lines BL1 and BL3 through third and fourth isolation devices or transistors 32 and 34, respectively, tandemly arranged with respect to the first pair of cross coupled devices 20 and 22. A precharging or pull up circuit 36 has a first field effect transistor 38 connected between a voltage source terminal VH and the first bit line BL1, a second field effect transistor 40 connected between the voltage source terminal VH and the third bit line BL3 and a third field effect transistor 42, acting as a voltage equalizing transistor, coupled between the first and third bit lines BL1 and BL3. The voltage at terminal VH may be equal to +10 volts.

Clock circuits 44 of any known appropriate type provide pulses for operating the first sense amplifying system 18. These pulses include a control pulse A which is applied to the gate electrodes of isolation transistors 26 and 32, a control pulse B which is applied to the gate electrodes of isolation transistors 24 and 34, a strobe pulse S which is applied to a common node D between the tandemly arranged first and second pairs of cross coupled transistor devices 20, 22 and 28, 30 and a precharge pulse P which is applied to the gate electrodes of the three transistors of precharging circuit 36.

A second sense amplifying system 46, similar to the first system 18, having a first pair of cross coupled field effect transistor devices 48 and 50 is coupled to the second and fourth bit lines BL2 and BL4 through first and second isolation devices or transistors 52 and 54, respectively. The second sense amplifying system 46 also includes a second pair of cross coupled field effect transistor devices 56 and 58 coupled to the second and fourth bit lines BL2 and BL4 through third and fourth isolation devices or transistors 60 and 62, respectively, each of the isolation devices being preferably field effect transistors. The first and second pairs of cross coupled devices 48, 50 and 56, 58 are tandemly arranged with respect to each other. A precharging or pull up circuit 64 has a first field effect transistor 66 connected between the voltage source terminal VH and the second bit line BL2, a second field effect transistor 68 connected between the voltage source terminal VH and the fourth bit line BL4 and a third field effect transistor 70, acting as a voltage equalizing transistor, coupled between the second and fourth bit lines BL2 and BL4.

Control pulse A from the clocking circuits 44 is applied to the gate electrodes of isolation transistors 54 and 60, control pulse B is applied to the gate electrodes of isolation transistors 52 and 62, strobe pulse S is applied to a common node D between the tandemly arranged first and second pairs of cross coupled transistor devices 48, 50 and 56, 58 and precharge pulse P is applied to the gate electrodes of the three transistors of the precharging circuit 64.

Figure 2:
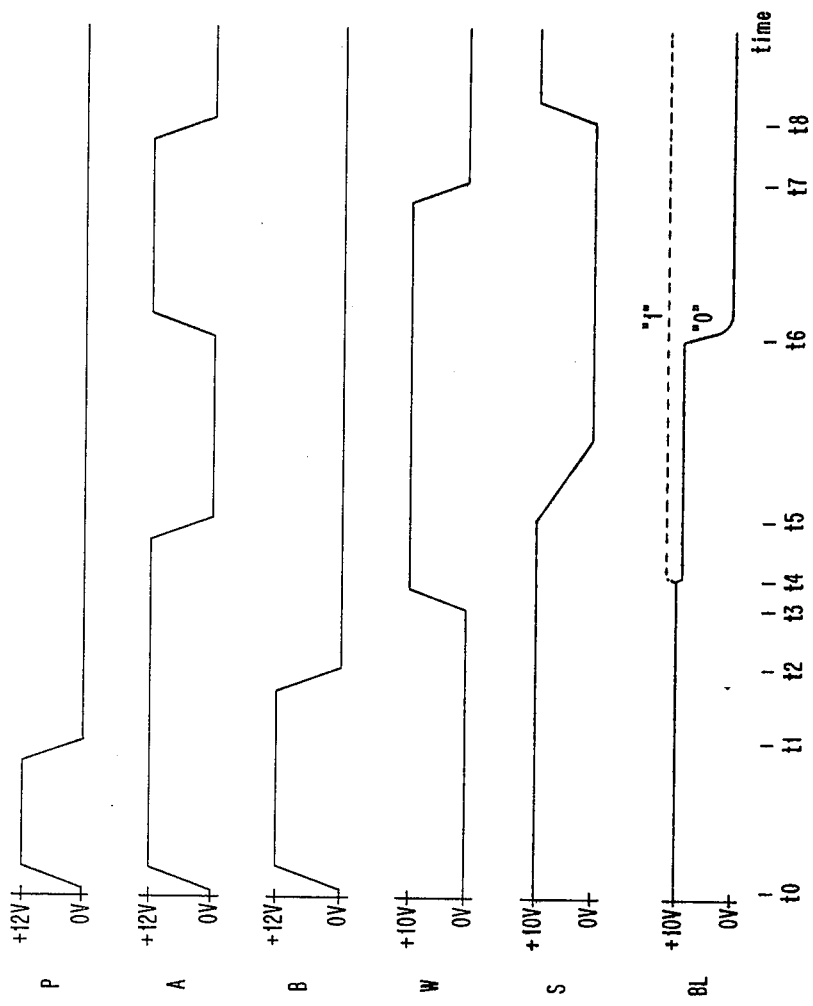
FIG. 2 is a pulse program which may be used to operate the sense amplifying system of the invention as illustrated in FIG. 1.

A pulse program which may be used to operate the memory of FIG. 1 is indicated in FIG. 2 of the drawings. The pulses indicated in FIG. 2 include the control pulses A and B, strobe pulse S and precharge pulse P, along with a word line pulse W which is applied selectively to word lines W1 and W2 and a signal voltage BL which may be produced on the bit lines BL1, BL2, BL3 and BL4 during a reading or signal sensing operation.

To read information from, e.g., cell 12B coupled to the first bit line BL1 and cell 12F coupled to the third bit line BL3 in the array 10, precharge pulse P is applied at time t0 to precharging circuit 36 to precharge bit lines BL1 and BL3 to voltage VH equal to +10 volts. Simultaneously, control pulse A is applied to transistors 26 and 32 to also charge nodes E and F to +10 volts and control pulse B is applied to transistors 24 and 34 to likewise charge nodes G and H to +10 volts, while strobe pulse S, applied to node D, is held at +10 volts. Thus, first and third bit lines BL1 and BL3 and nodes D, E, F, G and H are all charged to +10 volts. At time t1, precharge pulse P is turned off, isolating the first and third bit lines BL1 and BL3 from the voltage source terminal VH and from each other. At time t2, control pulse B is turned off to isolate node G from the first bit line BL1 and to isolate node H from the third bit line BL3, providing at node G a reference voltage for the first pair of cross coupled transistors 20, 22 and at node H a reference voltage for the second pair of cross coupled transistors 28, 30. At time t3, the word pulse W is applied from word line W2 to the one-device cells 12B and 12F in a known manner to apply the signals stored in these cells 12B and 12F to the charged bit lines BL1 and BL3, respectively. As is known, if charge is withdrawn from a bit line, the voltage on that bit line will decrease at time t4, as indicated in the solid curve BL, representing a stored "0" digit of binary information, but if charge is not withdrawn from the bit line, the voltage may rise at time t4, as indicated in the dashed curve BL, representing a stored "1" digit of binary information. As is known the reference levels from the bit line, the voltage may rise at time t4, as indicated in the dashed curve BL, representing a stored "1" digit of binary information. As is known the reference levels on the bit lines may be established in many different ways, e.g., by capacitively coupling the selected word line to the bit lines or the amplifying latches may be asymmetrically adjusted to cause the latches to appropriately respond to both the "0" and "1" signal voltage. The voltage on bit lines BL1 and BL3, representing either a "0" digit or a "1" digit, is applied from the first bit line BL1 to node F of the second pair of cross coupled transistor devices 28 and 30 through transistor 32 and from the third bit line BL3 to node E of the first pair of cross coupled transistor devices 20 and 22 through transistor 26. Accordingly, it can be seen that the first pair of cross coupled transistor devices 20 and 22 may now act as an amplifying latch or differential amplifier for the signal voltage being applied from the third bit line BL3 to node E, while the voltage at node G acts as the reference voltage. Likewise, the second pair of cross coupled transistor devices 28 and 30 may now act as an amplifying latch or differential amplifier for the signal voltage being applied from the first bit line BL1 to node F, while the voltage at node H acts as the reference voltage.

To amplify the signals now stored on nodes E and F, the control pulse A is turned off at time t5, turning off transistors 26 and 32, to isolate nodes E and F from the relatively high capacitance bit lines BL3 and BL1, respectively. Also at time t5, the strobe pulse S is gradually turned off to pull down node D to complete the amplification of the signals in the amplifiers 20, 22 and 28, 30. At time t6, control pulse A is again turned on to couple the amplified signal on node E to the third bit line BL3 and to couple the amplified signal on node F to the first bit line BL1. The amplified signals on bit lines BL1 and BL3 may now be fed through the bit line decoder 16 to the input/output terminal I/0 and may also be used to restore the information in cells 12B and 12F. As can be seen in curve BL of FIG. 2 of the drawings, at time t6, with a "0" having been stored in a sensed cell, the voltage on the bit line to which that cell is coupled drops rapidly, discharging through the conductive transistor device of the pair of cross coupled transistor devices. At time t7, with information restored in the sensed cells, the word pulse W is turned off, and at time t8 the control pulse A is turned off and the strobe pulse turned on to complete the reading operation.

As is well known, to write new information into the cells 12B and 12F, data is fed from the input/output terminal I/0 through the bit line decoder 16 to the appropriate amplifying latches 28, 30 and 20, 22, respectively, before being stored in these cells.

Of course, cells 12A and 12E may also be read out by the sense amplifying system 18 in the same manner as described hereinabove in connection with the sensing of cells 12B and 12F except that the word pulse W is applied to the word line W1 instead of to word line W2.

It can be seen that in the same manner the cells 12C and 12D coupled to the second bit line BL2 are sensed by the amplifying latch 56, 58 of the second sense amplifying system and the cells 12G and 12H coupled to the fourth bit line BL4 are sensed by the amplifying latch 48,50.

Although only two cells are illustrated as being connected to a bit line, it should be understood that many more cells, e.g., 128 cells, may be associated with each bit line. Furthermore, the array 10 may have 128 or more word lines, if desired.

Accordingly, it should be noted that a sense amplifying system has been provided for a two dimensionally operated memory having very small, closely packed cells wherein each sense amplifying system may have a pitch equal to the pitch of four bit lines of the memory by locating one system coupled to two bit lines on one side of a memory array and locating a second system coupled to two other bit lines of the array on the opposite side thereof.

It should also be noted that by connecting the sense amplifying system to the outside or edges of an array rather than locating it in the middle of the array, the bit lines become directly accessible for writing, switching noises are mitigated or eliminated and read modify write cycles of operation are more readily performed.

While the invention has been particularly shown and described with reference to a preferred embodiment thereof, it will be understood by those skilled in the art that various changes in form and details may be made therein without departing from the spirit and scope of the invention.

What is claimed is:

1. A sense amplifying system comprising;
 first and second access lines,
 first and second differential amplifiers,
 means including a first pair of isolation devices for selectively coupling said first differential amplifier to said first and second access lines,
 means including a second pair of isolation devices for selectively coupling said second differential amplifier to said first and second access lines, and
 means for establishing a reference potential coupled to said first and second access lines.

2. A sense amplifying system comprising;
 first and second access lines,
 a differential amplifier,
 first and second isolation devices coupling said differential amplifier to said access lines,
 means for controlling said first and second isolation devices independently, and
 means for charging each of said first and second access lines to a voltage of a predetermined magnitude.

3. A sense amplifying system comprising;
 first and second bit lines,
 an amplifying latch,
 a first isolation device connected between said first bit line and one side of said amplifying latch, a second isolation device connected between said second bit line and the opposite side of said amplifying latch,
first means for controlling said first isolation device,
second means for controlling said second isolation device, and
means for charging each of said first and second bit lines to a voltage of a predetermined magnitude.

4. A sense amplifying system as set forth in claim 3 wherein said first and second isolation devices each include a field effect transistor having a gate electrode and said first and second controlling means are coupled to said gate electrodes.

5. A sense amplifying system as set forth in claim 4 wherein said charging means include a third field effect transistor coupled to said first bit line, a fourth transistor coupled to said second bit line and a fifth transistor connected between said first and second bit lines.

6. A sense amplifying system as set forth in claim 1 wherein said first pair of isolation devices is a pair of field effect transistors and said first and second amplifiers are first and second amplifying latches arranged in tandem.

7. A sense amplifying system comprising;
first and second bit lines,
first and second differential amplifiers,
first and second isolation devices connected between said first differential amplifier and said first and second bit lines,
third and fourth isolation devices connected between said second differential amplifier and said first and second bit lines,
first means for controlling said first and fourth isolation devices,
second means for controlling said second and third isolation devices, and
means for charging said first and second bit lines.

8. A sense amplifying system as set forth in claim 7 wherein said first and third isolation devices are connected to said first bit line and said second and fourth isolation devices are connected to said second bit line.

9. A memory comprising;
an array including;
first, second, third and fourth consecutively and parallelly arranged bit lines, a plurality of parallel word lines arranged orthogonal to said bit lines and a cell disposed at the intersection of each of said bit and word lines,
a first sense amplifying system;
first and second tandemly arranged differential amplifiers connected to the ends of said first and third bit lines at one edge of said array,
first means including a first pair of isolation devices for selectively coupling said first differential amplifier to said first and third bit lines,
second means including a second pair of isolation devices for selectively coupling said second differential amplifier to said first and third bit lines, and
third means for establishing a reference potential coupled to said first and third bit lines, and
a second sense amplifying system including;
third and fourth tandemly arranged differential amplifiers connected to the ends of said second and fourth bit lines at an edge of said array opposite to that of said one edge,
fourth means including a third pair of isolation devices for selectively coupling said third differential amplifier to said second and fourth bit lines,
fifth means including a fourth pair of isolation devices for selectively coupling said fourth differential amplifiers to said second and fourth bit lines, and
sixth means for establishing said reference potential coupled to said second and fourth bit lines.

10. A memory as set forth in claim 9 wherein each of the isolation devices of said first, second, fourth and fifth means is controlled independently of the other isolation device.

* * * * *